United States Patent
Mun et al.

(10) Patent No.: US 11,092,495 B2
(45) Date of Patent: Aug. 17, 2021

(54) OPTICAL EMISSION SPECTROSCOPY SYSTEM, METHOD OF CALIBRATING THE SAME, AND METHOD OF FABRICATING SEMICONDUCTOR DEVICE

(71) Applicant: SAMSUNG ELECTRONICS CO., LTD., Suwon-si (KR)

(72) Inventors: Jeongil Mun, Hwaseong-si (KR); Hyung Joo Lee, Hwaseong-si (KR); Jongwoo Sun, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/293,026

(22) Filed: Mar. 5, 2019

(65) Prior Publication Data

US 2020/0049560 A1 Feb. 13, 2020

(30) Foreign Application Priority Data

Aug. 7, 2018 (KR) .................. 10-2018-0091994

(51) Int. Cl.

| | |
|---|---|
| *G01J 3/443* | (2006.01) |
| *G01J 3/02* | (2006.01) |
| *G01J 3/04* | (2006.01) |
| *G01N 21/27* | (2006.01) |
| *G01N 21/67* | (2006.01) |
| *G01N 21/68* | (2006.01) |
| *H01J 37/32* | (2006.01) |

(52) U.S. Cl.
CPC .............. *G01J 3/443* (2013.01); *G01J 3/0229* (2013.01); *G01N 21/67* (2013.01); *G01N 21/68* (2013.01); *H01J 37/32972* (2013.01); *G01J 3/04* (2013.01); *G01J 2003/045* (2013.01)

(58) Field of Classification Search
CPC ...... G01J 2003/045; G01J 3/0229; G01J 3/04; G01J 3/443; G01J 2003/2866; G01J 2003/2879
See application file for complete search history.

(56) References Cited

U.S. PATENT DOCUMENTS

| | | | |
|---|---|---|---|
| 7,167,239 B2 * | 1/2007 | Yamamoto | ................ G01J 3/04 356/326 |
| 8,125,633 B2 | 2/2012 | Whelan et al. | |
| 8,416,509 B2 | 4/2013 | Yi et al. | |
| 9,025,143 B2 | 5/2015 | Hahn | |
| 9,721,768 B2 | 8/2017 | Kim et al. | |
| 9,874,524 B2 | 1/2018 | Cho et al. | |
| 10,365,212 B2 * | 7/2019 | Kueny | ............. H01J 37/32963 |
| 10,557,753 B2 * | 2/2020 | Loi | ........................ G01J 3/2803 |
| 2005/0162650 A1 * | 7/2005 | Yamamoto | ................ G01J 3/04 356/328 |

(Continued)

FOREIGN PATENT DOCUMENTS

| | | |
|---|---|---|
| KR | 10-1279911 B1 | 6/2013 |
| KR | 10-1829811 B1 | 2/2018 |
| KR | 10-2019-0113256 A | 10/2019 |

*Primary Examiner* — Violeta A Prieto
(74) *Attorney, Agent, or Firm* — Lee IP Law, P.C.

(57) ABSTRACT

An optical emission spectroscopy system may include a reference light source, an analyzer to receive and analyze light transmitted from the reference light source, and a calibrator to calibrate light emitted from the reference light source. The calibrator may change a calibration ratio in accordance with an incidence angle of the light.

20 Claims, 10 Drawing Sheets

(56) References Cited

U.S. PATENT DOCUMENTS

| | | |
|---|---|---|
| 2017/0067779 A1 | 3/2017 | Kim et al. |
| 2017/0146402 A1* | 5/2017 | Learmonth ............ G01N 21/25 |
| 2018/0136042 A1* | 5/2018 | Goldring ............... G01J 3/0289 |
| 2018/0136118 A1* | 5/2018 | Kueny ................... G01N 21/73 |
| 2019/0301930 A1* | 10/2019 | Loi .......................... G01J 3/36 |
| 2019/0301937 A1 | 10/2019 | Mun et al. |

* cited by examiner

OPTICAL EMISSION SPECTROSCOPY SYSTEM, METHOD OF CALIBRATING THE SAME, AND METHOD OF FABRICATING SEMICONDUCTOR DEVICE

CROSS-REFERENCE TO RELATED APPLICATION

Korean Patent Application No. 10-2018-0091994, filed on Aug. 7, 2018, in the Korean Intellectual Property Office, and entitled: "Optical Emission Spectroscopy System, Method of Calibrating the Same, and Method Of Fabricating Semiconductor Device," is incorporated by reference herein in its entirety.

BACKGROUND

1. Field

The present disclosure relates to an optical emission spectroscopy system, and in particular, to an optical emission spectroscopy system for measuring a state of plasma produced in a process chamber and a method of calibrating the same.

2. Description of the Related Art

With an increasing demand for advanced processes for fabricating a semiconductor device or a flat panel display device, a plasma processing system is being used to perform various processes. In the plasma processing system, a radio frequency (RF) power is applied to a stage or an electrode to produce an electromagnetic field in a plasma chamber, and plasma produced by the electromagnetic field is used to process a substrate.

SUMMARY

According to an embodiment, an optical emission spectroscopy system may include a reference light source, an analyzer to receive and analyze light transmitted from the reference light source, and a calibrator to calibrate light emitted from the reference light source. The calibrator may change a light receiving ratio in accordance with an incidence angle of the light incident on the light.

According to an embodiment, a method of calibrating an optical emission spectroscopy system may include emitting light from a reference light source, calibrating light emitted from the reference light source, and analyzing the calibrated light. Calibrating light emitted from the reference light source may include obtaining a calibration factor in accordance with an incidence angle of the light.

According to an embodiment, a method of fabricating a device may include calibrating an optical emission spectroscopy system, performing an inspection process on a process chamber, using the optical emission spectroscopy system, loading a substrate in the process chamber, and performing a plasma process on the substrate. Calibrating the optical emission spectroscopy system may include controlling an intensity of light in accordance with an incidence angle of the light.

BRIEF DESCRIPTION OF THE DRAWINGS

Features will become apparent to those of skill in the art by describing in detail exemplary embodiments with reference to the attached drawings in which.

DETAILED DESCRIPTION

In an optical emission spectroscopy system according to example embodiments, an optical emission spectroscopy (OES), which is an optical examining technology used in a plasma process for fabricating a device, may be used to measure physical characteristics of plasma produced in a process chamber. In the present specification, a substrate may be, e.g., a semiconductor wafer used to fabricate a semiconductor device, a glass substrate used to fabricate a flat panel display device, and the like. The plasma process on the substrate may be, e.g., an etching process, a chemical vapor deposition process, an ashing process, a cleaning process, and the like.

Physical characteristics (e.g., electron density or ion density) of plasma in the process chamber may be parameters that affect process characteristics (e.g., process rate, homogeneity, uniformity, and wafer-to-wafer repeatability) of the plasma process. For example, an electron density in the process chamber may affect excitation, ionization, and dissociation of electrons. Thus, in order to perform the plasma process effectively, it is important to examine an internal state of the process chamber and to know physical characteristics of plasma produced in the process chamber.

Figure 1:
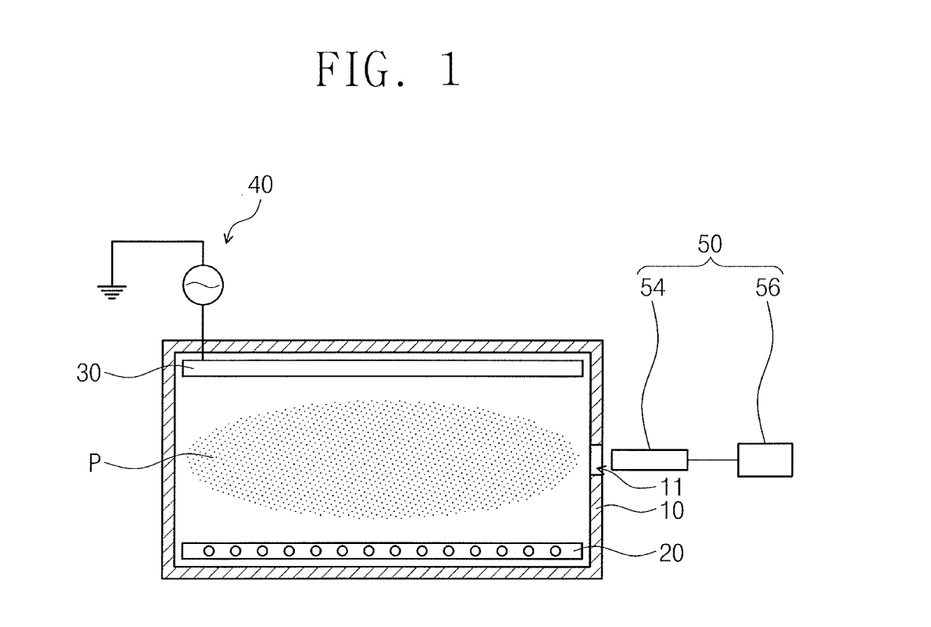
FIG. 1 illustrates a typical plasma processing system and an optical emission spectroscopy system.

FIG. 1 illustrates an optical emission spectroscopy system 50 provided in a plasma processing system. Referring to FIG. 1, a stage 20 and a showerhead 30 may be provided in a process chamber 10 to face each other. An RF power from an RF power part 40 may be supplied to the showerhead 30 to produce plasma P in the process chamber 10. A typical optical emission spectroscopy system 50 may include a light receiving part 54 and an analyzing part 56. A window 11 may be provided in a sidewall of the process chamber 10, and the light receiving part 54 may receive a plasma light PL (FIG. 2) through the window 11. The plasma light PL received by the light receiving part 54 may be transmitted to the analyzing part 56 to be analyzed.

Figure 2:
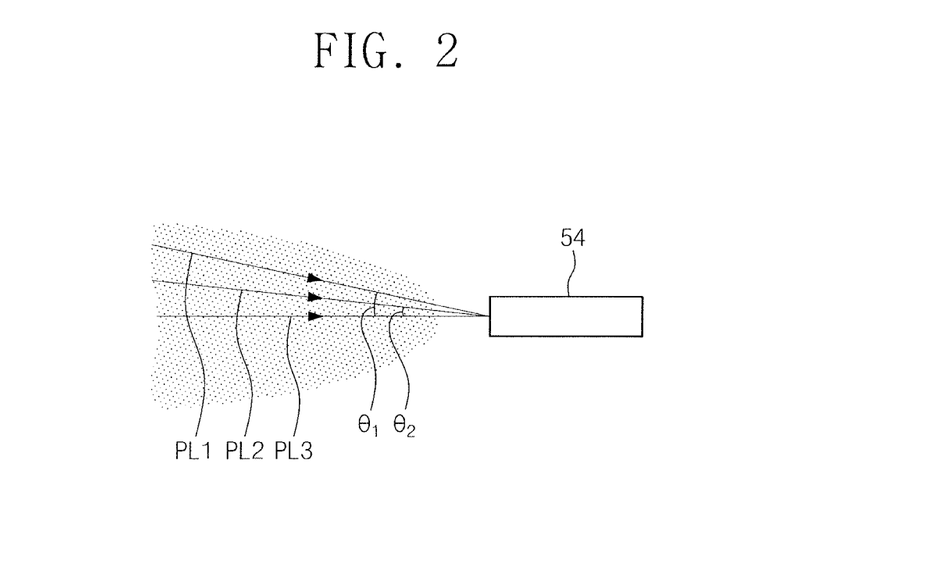
FIG. 2 illustrates an enlarged view of light incident on a light receiving part of FIG. 1.

FIG. 2 illustrates the plasma light PL incident on the light receiving part 54 of FIG. 1. Referring to FIGS. 1 and 2, the plasma light PL incident on the light receiving part 54 may include a plurality of beams at a plurality of incidence angles. Differences between the incidence angles may be small. In practice, the plasma light PL may be a single beam, but in the present specification, the plasma light PL will be described as a plurality of beams. In addition, an angle of the plasma light PL illustrated in the drawings may differ from those of the actual light. As an example, the plasma light PL incident on the light receiving part 54 may include a first plasma light beam PL1, a second plasma light beam PL2, and a third plasma light beam PL3. The first plasma light beam PL1 may have a first incidence angle $\theta 1$ and the second plasma light beam PL2 may have a second incidence angle $\theta 2$. The third plasma light beam PL3 may be incident on the light receiving part 54 at an incidence angle of 0° (i.e., perpendicularly).

Light intensities of the plasma light beams PL1, PL2, and PL3 incident on the light receiving part 54 may be different from each other, e.g., a distribution of the plasma P in the process chamber 10 may vary from region to region. Furthermore, when a plurality of process chambers are provided, a difference in characteristics (e.g., model or position) between the optical emission spectroscopy systems, which are respectively provided for the process chambers, may lead to a difference in damping ratios of light amounts between the optical emission spectroscopy systems, in each of the incidence angles $\theta 1$, $\theta 2$, and $\theta 3$. Thus, to realize a more precise optical emission spectroscopy system, the damping ratios of light intensities between the optical emission spectroscopy systems for each of the incidence angles $\theta 1$, $\theta 2$, and $\theta 3$ may be considered.

The plurality of process chambers may perform the same plasma process. For example, in the plurality of process chambers, the plasma process may be performed under the same process condition (e.g., process time, process gas, and so forth). In an embodiment, after the plasma process in each of the process chambers, OES spectrums may be measured by a plurality of optical emission spectroscopy systems provided for respective process chambers.

Figure 3:
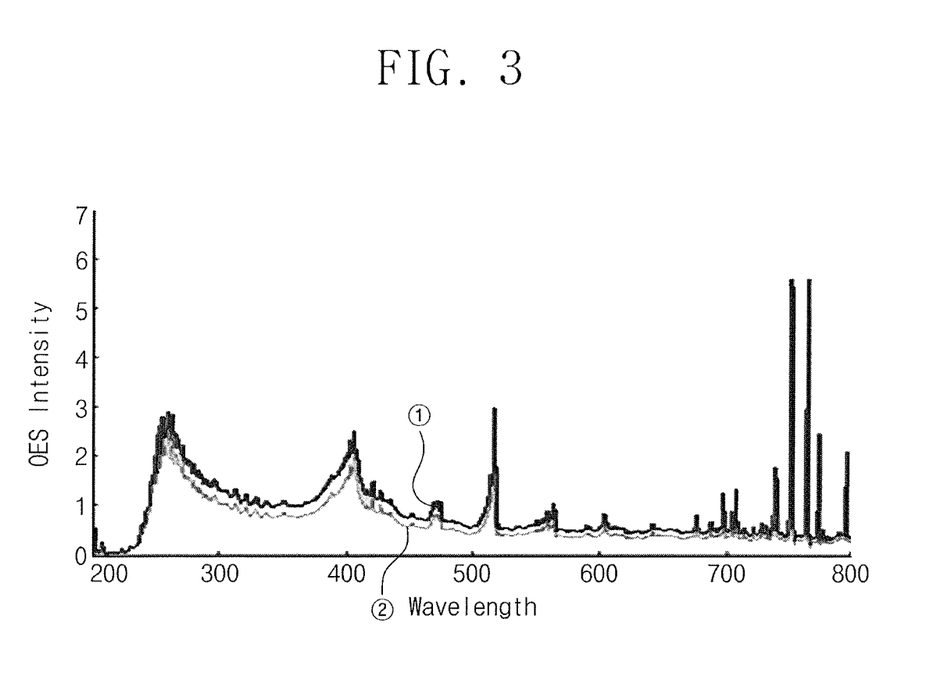
FIG. 3 illustrates a graph showing data obtained by an optical emission spectroscopy system.

FIG. 3 is a graph showing OES spectrums obtained from a plurality of process chambers, using a plurality of optical emission spectroscopy systems. The OES spectrums depicted by curves ① and ② in FIG. 3 resulted from the same plasma process being performed in each of two different process chambers under the same conditions. While be no difference between the measurement results may be expected, as shown in FIG. 3, there may be a difference in intensities between the OES spectrums of the curves ① and ②. Such a difference between the OES spectrums may result from various causes. For example, a difference in a cumulative usage time, a life span, a model type, a deformation of a light receiving part (e.g., an optical fiber), a difference in a degree of contamination of the window 11 and/or other variations, may lead to the difference between the OES spectrums. In this case, reliably comparing plasma characteristics obtained from the process chambers may be difficult and, even if plasma is abnormally produced in a specific chamber, such abnormality may not be sensed by the optical emission spectroscopy system. That is, the optical emission spectroscopy system may suffer from low reliability. Accordingly, to improve the reliability of the optical emission spectroscopy process, OES spectrums obtained from a plurality of optical emission spectroscopy systems for respective process chambers may be calibrated. In an embodiment, the calibration may include normalizing intensities of OES spectrums obtained by a plurality of optical emission spectroscopy systems.

Figure 4:
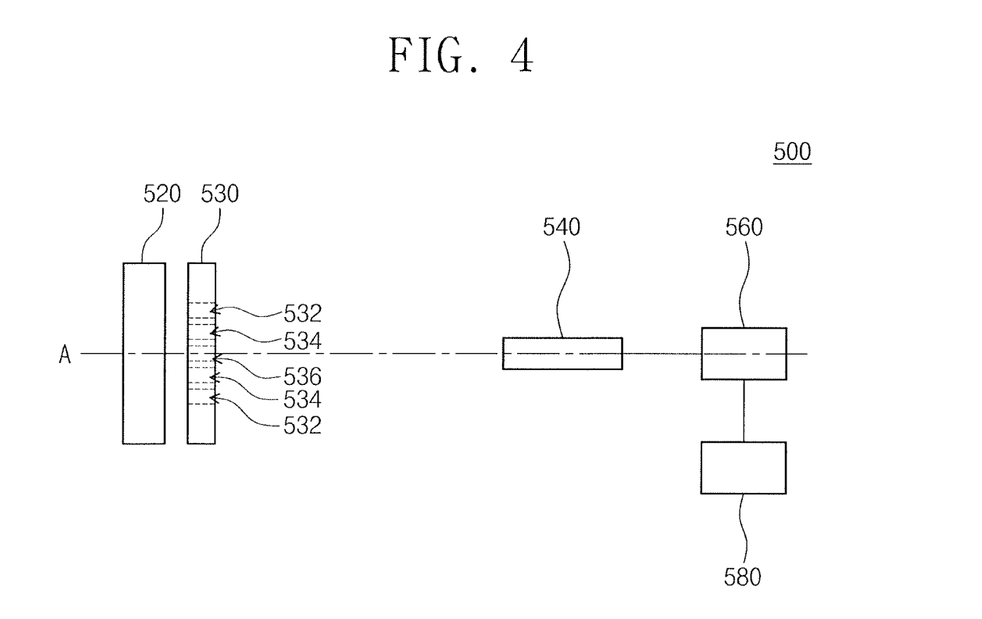
FIG. 4 illustrates an optical emission spectroscopy system according to some embodiments.
Figure 5:
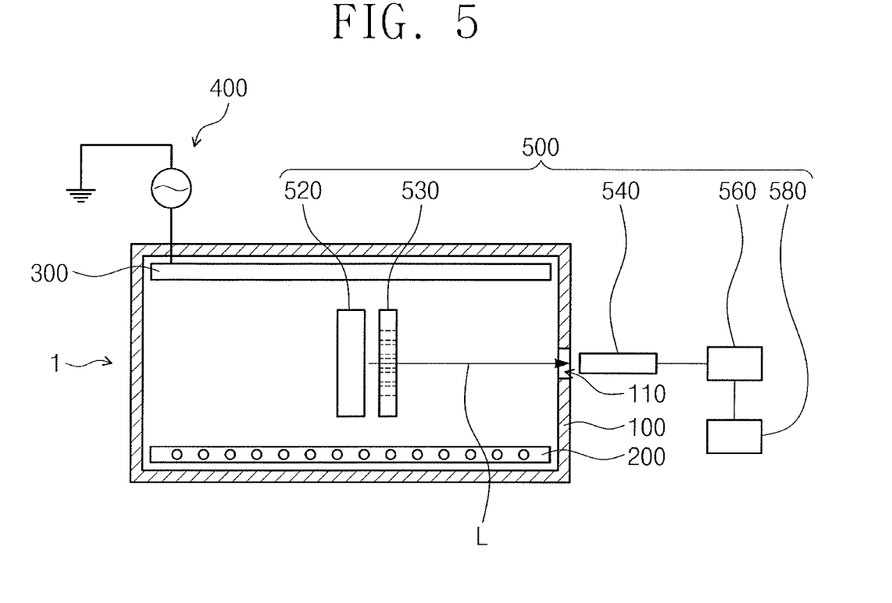
FIG. 5 illustrates a plasma processing system and an optical emission spectroscopy system of FIG. 4.

FIG. 4 illustrates an optical emission spectroscopy system 500 according to some embodiments. FIG. 5 illustrates a plasma processing system 1 and the optical emission spectroscopy system 500 of FIG. 4.

The plasma processing system 1 may include a process chamber 100, a stage 200, a showerhead 300, and an RF power part 400. For example, the plasma processing system 1 may be a capacitively-coupled plasma (CCP) system, an inductively-coupled plasma (ICP) system, a microwave plasma system, or any other plasma processing systems.

The process chamber 100 may have an internal space, in which a plasma process on the substrate will be performed. That is, plasma for processing the substrate may be produced in the internal space. The process chamber 100 may be hermetically sealed such that the process chamber 100 is in a vacuum state. The process chamber 100 may include upper and lower chambers coupled to each other, and may have a hollow hexahedral shape, a hollow cylindrical shape, or any other shape.

A window 110 may be provided in the process chamber 100, e.g., in a sidewall thereof. The window 110 may be formed of glass, quartz, or other optically transparent materials, e.g., transparent to a wavelength of light to be detected and analyzed. The window 110 may transmit infrared, ultraviolet, or visible light. An opening provided with the window 110 may be sealed to prevent a foreign material from entering the process chamber 100 or to maintain the vacuum state of the process chamber 100. In certain embodiments, the window 110 may be provided in a top surface or a gas exhausting part of the process chamber 100, instead of the sidewall of the process chamber 100. In certain embodiments, a plurality of the windows 110 may be provided in the process chamber 100. The window 110 may be coated with an anti-reflection material and may have a uniform transmittance property, regardless of a wavelength of an incident light.

The process chamber 100 may include a gas supply hole and a gas exhaust hole. A process gas may be supplied into the process chamber 100 through the gas supply hole, and an unreacted source gas and a by-product may be exhausted form the process chamber 100 through the gas exhaust hole. In addition, a deposition shield or the like may be further provided in the opening including the window 110.

The stage 200 may be provided in the internal space of the process chamber 100 to support the substrate. The stage 200 may be on an internal bottom surface of the process chamber 100. The stage 200 may have a plate shape. As an example, the stage 200 may include an electrostatic chuck to hold the substrate using an electrostatic force. The stage 200 may include a heater, e.g., a heating wire that is buried in the stage 200 for heating the substrate to a temperature for the plasma process.

The showerhead 300 may be in an internal space, e.g., an internal upper surface, of the process chamber 100. The showerhead 300 may face the stage 200, e.g., a surface of the stage 200 holding the substrate. The showerhead 300 may uniformly provide a process gas onto a substrate. The showerhead 300 may be used as, and may herein be referred to as, an upper electrode 300.

The RF power part 400 may apply a radio frequency (RF) power, to produce or control plasma, to the upper electrode 300. The RF power part 400 may include one or more power supply parts. In certain embodiments, the RF power part 400 may apply the RF power to another part, instead of the upper electrode 300. As an example, when a lower electrode is buried in the stage 200, the RF power part 400 may apply the RF power to the lower electrode in the stage 200.

When the RF power is applied to the process chamber 100, an electric field between the stage 200 and the upper electrode 300 may be formed by a potential difference between the stage 200 and the upper electrode 300. Thus, plasma may be produced in the process chamber 100. A density of plasma produced on the substrate may be controlled by changing a potential difference between the stage 200 and the upper electrode 300. A plasma state in the process chamber 100 may be controlled by adjusting the RF power from the RF power part 400.

Referring to FIGS. 4 and 5, the optical emission spectroscopy system 500 may include a reference light source 520, a calibrator, e.g. a sub-calibrating part 530, a light receiving part 540, an analyzing part 560, and a controller 580. The parts constituting the optical emission spectroscopy system 500 may be classified into inner parts and outer parts, depending on whether they are positioned inside or outside the process chamber 100. As an example, the reference light source 520 and the sub-calibrating part 530 may be inside the process chamber 100, and the light receiving part 540, the analyzing part 560, and the controller 580 may be outside the process chamber 100. When the calibration process on the optical emission spectroscopy system 500 is finished, the reference light source 520 and the sub-calibrating part 530 may be unloaded from the process chamber 100.

The optical emission spectroscopy system 500 may be provided adjacent to the window 110. The optical emission spectroscopy system 500 may collect light, which is produced in a region between the stage 200 and the upper electrode 300, through the window 110.

The reference light source 520 may emit a reference light L for calibrating the optical emission spectroscopy system 500. Hereinafter, for convenience in description, the reference light L may be referred to as a light L. The reference light source 520 may emit, e.g., ultraviolet light. Although FIG. 4 illustrates an example in which the reference light source 520 has a cylindrical body, any specific shape of the reference light source 520 may be used. For example, the reference light source 520 may radially emit light. The reference light source 520 may emit multi-wavelength light, but the description that follows will refer to an example in which the reference light source 520 emits monochromatic light.

In practice, the light L may be a single beam, but, in the present specification, it will be described that the light L includes a plurality of light beams. In addition, a ratio and/or an angle of the light L illustrated in the drawings may differ from that of the actual light. As an example, the light L incident on the light receiving part 540 may include a first light beam L1, a second light beam L2, and a third light beam L3. As described above, the first light beam L1 may have the first incidence angle θ1 and the second light beam L2 may have the second incidence angle θ2. The third light beam L3 may have an incidence angle of 0° or may be perpendicularly incident on the light receiving part 540.

The light receiving part 540 may receive the light L emitted from the reference light source 520. The light receiving part 540 may be adjacent to the window 110. The light receiving part 540 may include an optical fiber. The light receiving part 540 may transfer the received light L to the analyzing part 560. The analyzing part 560 or analyzer may be an optical emission spectroscopy (OES) system to analyze a plasma state in the process chamber 100. For example, the analyzing part 560 may convert the received light L, which contains information on reaction between the plasma P and the substrate in the process chamber 100, to an electric signal, e.g., may include a photodetector, and may analyze the electric signal, e.g., may include a processor, to obtain the information on the reaction between the plasma P and the substrate. The analyzing part 560 may include a display. Light may be directly incident on the analyzing part 560, e.g., on the photodetector thereof.

The sub-calibrating part 530 may be between the reference light source 520 and the light receiving part 540. The sub-calibrating part 530 may be adjacent to the reference light source 520, e.g., with no intervening elements. The sub-calibrating part 530 may have a size corresponding to the reference light source 520, e.g., may be large enough for all light output from the reference light source 520 to be incident thereon. The reference light source 520, the sub-calibrating part 530, and the light receiving part 540 may be coaxial to a central axis A.

Figure 6:
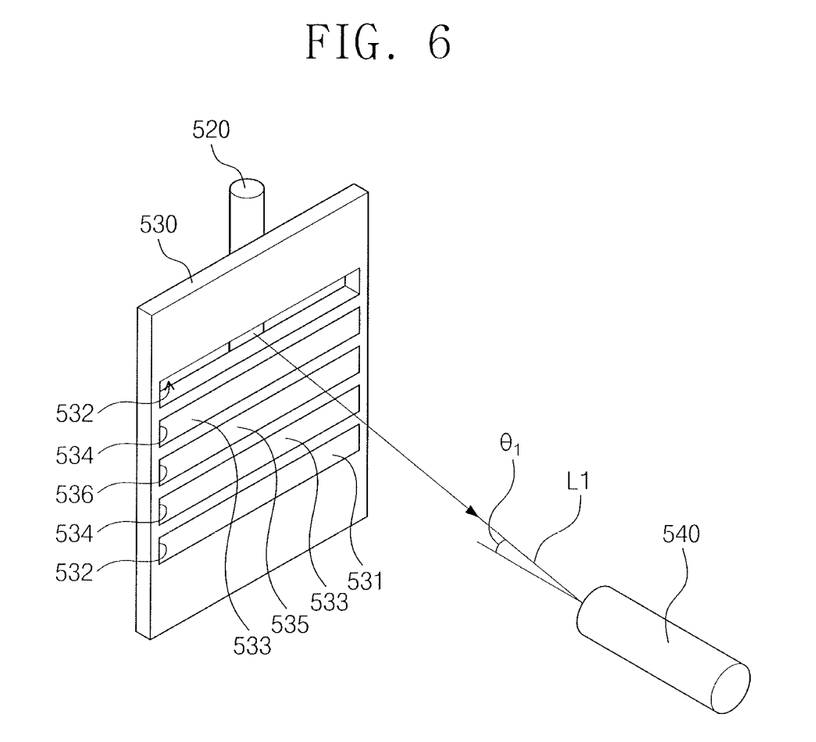
FIG. 6 illustrates a sub-calibrating part of FIG. 4, according to some embodiments.

FIG. 6 illustrates a sub-calibrating part of FIG. 4, according to some embodiments. The sub-calibrating part 530 may include a shade. Referring to FIG. 6, the sub-calibrating part 530 may include a first shade 531, a second shade 533, a third shade 535, a first slit 532, a second slit 534, and a third slit 536. As an example, the sub-calibrating part 530 may be provided in the form of a plate, e.g., a flat, rectangular shape. The slits 532, 534, 536 may extend further along a first direction than a second direction, both of which are orthogonal to the central axis A, and the shades 531, 533, 535 may correspond to the slits. If the first shade 531 is opened, the first slit 532 transmits light incident thereon. If the second shade 533 is opened, the second slit 534 transmits light incident thereon. If the third shade 535 is opened, the third slit 536 transmits light incident thereon. Otherwise, respective shades block light from being transmitted by corresponding slits. When closed, the respective shades may be between the reference light source 520 and corresponding slits, or may be between corresponding slits and the light receiving part 540, such that light is not transmitted from the slits. As shown in FIG. 6, individual shades may be provided for each slit. Alternatively, a shade having a single opening may be used to selectively allow individual slits to transmit light.

The first and second slits 532 and 534 may be symmetric about the central axis A. Hereinafter, it is assumed that if the first and second slits 532 and 534 are symmetric about the central axis A or if the first and second slits 532 and 534 have the same incidence angle to the light receiving part 540, the first and second slits 532 and 534 receive the same light intensity. In particular, the first slit 532 may include an upper first slit and a lower first slit with respect to the central axis A, and may receive light at the first incidence angle θ1 (or the first incidence angle −θ1.) Similarly, the second slit 534 may include an upper second slit and a lower second slit with respect to the central axis A, and may receive light at the second incidence angle θ2 (or the second incidence angle −θ1.) Alternatively, only one of the upper and lower first slits and only one of the upper and lower second slits may be used or provided. The third slit 536 may be a single, central slit.

The controller 580 may control shades 531, 533, and 535 of the sub-calibrating part 530 to block some of the slits 532, 534, and 536, and to open others. The controller 580 may selectively open and close each of the shades 531, 533, and 535. As an example, the shades 531, 533, and 535 may be opened and closed in a sliding manner, e.g., side to side or up and down. Alternatively, the sub-calibrating part 530 may include a shutter (e.g., a circular shutter), an electronic shade, e.g., a liquid crystal, and the like to control transmission of light through the slits. As shown in FIG. 6, if the first shade 531 is opened, a portion of the light L emitted from the reference light source 520 (e.g., the first light beam L1 with the first incidence angle) is transmitted through the first slit 532 to be incident on the light receiving part 540.

Referring back to FIGS. 4 and 5, the controller 580 may control the reference light source 520, the sub-calibrating part 530, the light receiving part 540, and the analyzing part 560. For example, the controller 580 may control the reference light source 520, the sub-calibrating part 530, the light receiving part 540, and the analyzing part 560 to calibrate the optical emission spectroscopy system 500.

The optical emission spectroscopy system 500 may measure light in the process chamber 100 to monitor a plasma state in the process chamber 100. The plasma state in the process chamber 100 may be analyzed by the optical emission spectroscopy system 500 provided outside the process chamber 100. Thus, the optical emission spectroscopy system 500 may not affect a process environment of the process chamber 100.

Figure 7:
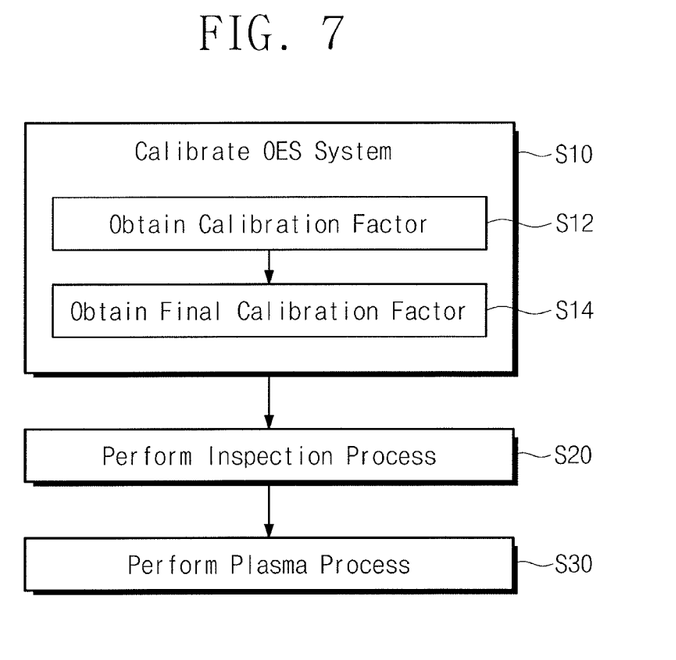
FIG. 7 illustrates a flowchart of fabricating a semiconductor device, using the plasma processing system and the optical emission spectroscopy system of FIG. 5.

FIG. 7 is a flowchart of fabricating a semiconductor device, using the plasma processing system 1 and the optical emission spectroscopy system 500 of FIG. 5. Referring to FIG. 7, the optical emission spectroscopy system 500 may be calibrated (in S10). The calibration of the optical emission spectroscopy system 500 may be performed to examine and maintain a process environment of the optical emission spectroscopy system 500. The calibration of the optical emission spectroscopy system 500 may include obtaining a calibration factor (in S12) and/or obtaining a final calibration factor (in S14). In certain embodiments, calibration of the optical emission spectroscopy system 500 may include improving elements of the process environment, e.g., cleaning and/or changing a part (e.g., the window and so forth).

Figure 8A:
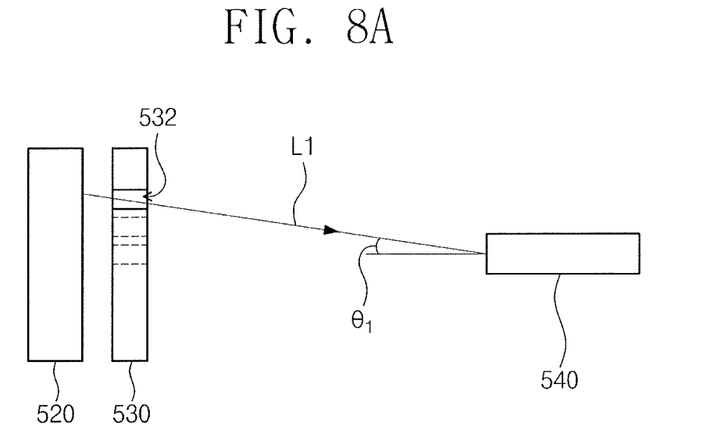
FIGS. 8A to 8C illustrate stages in a process of obtaining a calibration factor of FIG. 7, according to some embodiments.
Figure 8B:
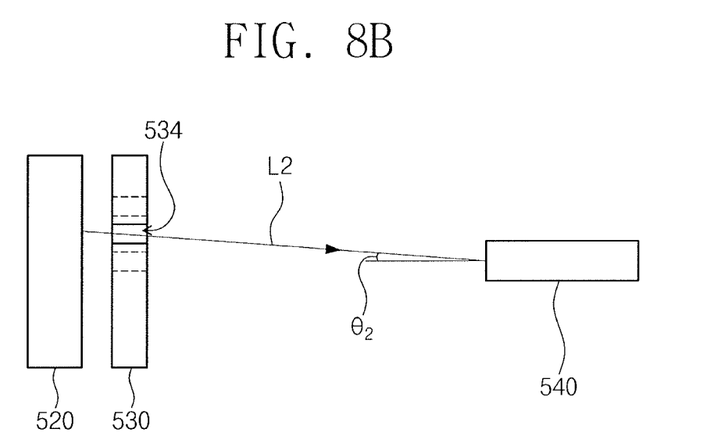
Figure 8C:
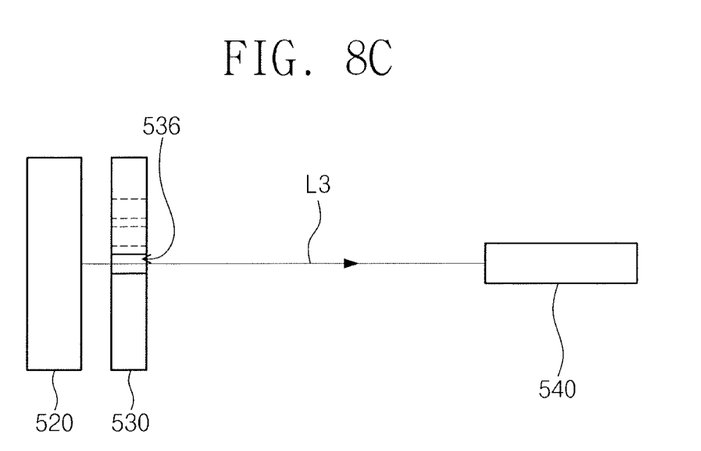

FIGS. 8A to 8C illustrate stages in a process (e.g., S12 of FIG. 7) of obtaining a calibration factor, according to some embodiments. The reference light source 520 of FIGS. 8A to 8C may radially emit light, but for convenience in illustration, only a portion of light incident on the light receiving part 540 is illustrated in FIGS. 8A to 8C.

Referring to FIG. 8A, the first light beam L1 emitted from the reference light source 520 may be incident on the light receiving part 540 through the first slit 532 of the sub-calibrating part 530. Here, the controller 580 may control the sub-calibrating part 530 to open only the first slit 532 and close the second slit 534 and the third slit 536, such that only the first light beam L1 passes through the sub-calibrating part 530. In other words, only the first light beam L1 emitted from the reference light source 520 and having the first incidence angle θ1 is incident on the light receiving part 540. The controller 580 may obtain a calibration factor for the first light beam L1, using the light receiving part 540 and the analyzing part 560. Hereinafter, in the present specification, the terms "incidence angle" and "angle" may be used with the same meaning. Furthermore, in the present specification, the first, second, and third lights have been mentioned for convenience in description, but the light may be an actually continuous light, e.g., a single beam, and, if necessary, it may be further divided into first, second, . . . , and n-th lights.

Referring to FIG. 8B, the second light beam L2 emitted from the reference light source 520 may be incident on the light receiving part 540 through the second slit 534 of the sub-calibrating part 530. Here, the controller 580 may control the sub-calibrating part 530 to open only the second slit 534 and close the first slit 532 and the third slit 536, such that only the second light beam L2 passes through the sub-calibrating part 530. In other words, only the second light beam L2 emitted from the reference light source 520 and having the second incidence angle θ2 is incident on the light receiving part 540. The controller 580 may obtain a calibration factor for the second light beam L2, using the light receiving part 540 and the analyzing part 560.

Referring to FIG. 8C, the third light beam L3 emitted from the reference light source 520 may be incident on the light receiving part 540 through the third slit 536 of the sub-calibrating part 530. Here, the controller 580 may control the sub-calibrating part 530 to open only the third slit 536 and close the first slit 532 and the second slit 534, such that the third light beam L3 passes through the sub-calibrating part 530. In other words, only the third light beam L3 emitted from the reference light source 520 and being perpendicularly incident on the light receiving part 54 is incident on the light receiving part 540. The controller 580 may obtain a calibration factor for the third light beam L3, using the light receiving part 540 and the analyzing part 560.

The calibration factors may be obtained by performing a plurality of measurement processes and setting a reference data based on the obtained measurement data. As an example, the calibration factors may be obtained by comparing numeric values of OES intensities obtained from a first process chamber and a second process chamber under the same conditions. The following Table 1 shows the calibration factors, which are obtained by a method according to an embodiment.

TABLE 1

| | First process chamber (reference value) | Second process chamber | Incidence angle calibration factor |
| --- | --- | --- | --- |
| First light beam L1 with first incidence angle | 60 | 55 | 0.916667 |
| Second light beam L2 with second incidence angle | 100 | 110 | 1.1 |
| Third light beam L3 with third incidence angle | 40 | 80 | 2 |

Table 1 shows OES spectrum intensities of light emitted from a first process chamber at various incidence angles (e.g., the first to third incidence angles) and OES spectrum intensities of light emitted from a second process chamber at various incidence angles (e.g., the first to third incidence angles). Here, the OES intensities obtained from the first process chamber may be set as reference values and calibration factors may be obtained using the OES intensities obtained from the first and second process chambers. As an example, each of the calibration factors may be given as a corresponding one of ratios of the OES intensities obtained from the second process chamber to the reference values (i.e., the OES intensities obtained from the first process chamber). The calibration factor may be used to calibrate the OES intensities obtained from the plurality of process chambers. Which process chamber is used to set the reference value may be changed, e.g., the reference value may be set based on the OES intensities obtained from the second process chamber rather than the first process chamber.

The controller 580 may calibrate a measured intensity of light incident on the light receiving part 540 based on a calibration factor given as a function of an incidence angle of the light. As an example, each of the OES intensities obtained from the second process chamber may be calibrated by dividing the obtained OES intensities by a corresponding one of the calibration factors. The calibration factors may be input to the analyzing part 560 and may be applied to calibrate the OES intensities. Once the calibration factors are obtained, the reference light source 520 may be unloaded from the process chamber 100.

Figure 9A:
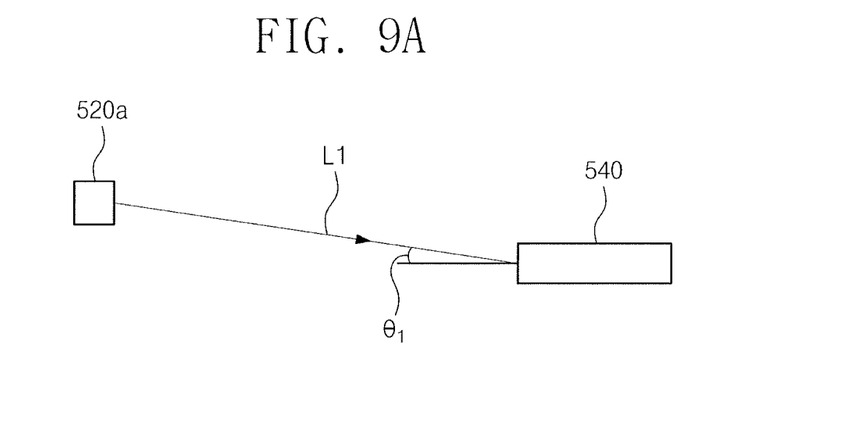
FIGS. 9A to 9C illustrate stages in a process of obtaining a calibration factor of FIG. 7, according to some embodiments.
Figure 9B:
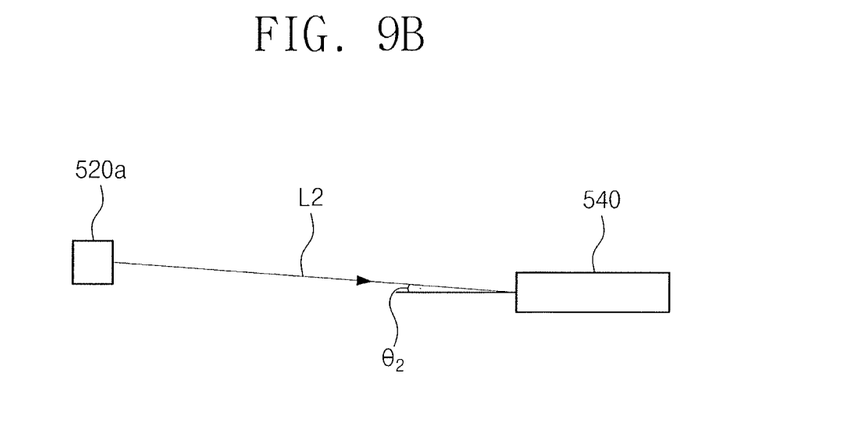
Figure 9C:
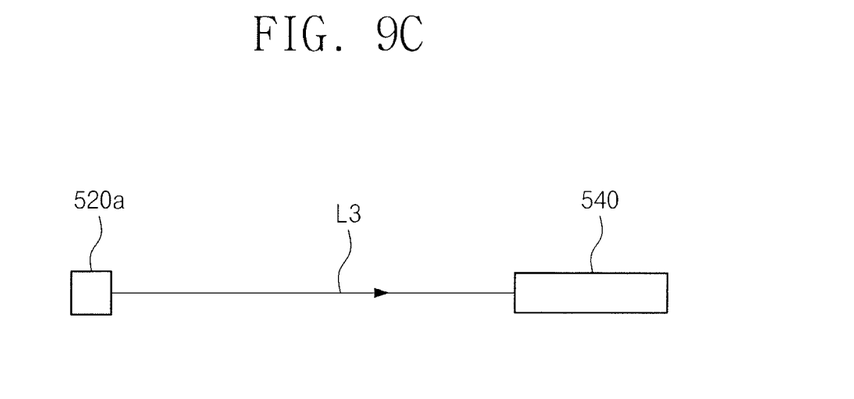

FIGS. 9A to 9C illustrate stages (e.g., S12 of FIG. 7) of obtaining a calibration factor of FIG. 7, according to some embodiments. Unlike the reference light source 520 having the cylindrical shape, the reference light source 520a may be provided to have a limited light emitting part, e.g., may be a point source.

Referring to FIGS. 9A to 9C, a position of the reference light source 520a may be changed to obtain a calibration factor. Under the control of the controller 580, the reference light source 520a may be placed to provide the first light beam L1 having the first incidence angle θ1 relative to a central axis of the light receiving part 540 to the light receiving part 540, and, then, a calibration factor for the first light beam L1 may be obtained (e.g., see FIG. 9A). Under the control of the controller 580, the reference light source 520a may be placed to provide the first light beam L2 having the second incidence angle θ2 relative the central axis of the light receiving part 540, and, then, a calibration factor for the second light beam L2 may be obtained (e.g., see FIG. 9B). Under the control of the controller 580, the reference light source 520a may provide the third light beam L3 having the third incidence angle θ3, e.g., the reference light source 520a may be coplanar with the light receiving part 540, to the light receiving part 540, and, then, a calibration factor for the third light beam L3 may be obtained (e.g., see FIG. 9C). In this case, even when the afore-described sub-calibrating part 530 is not provided, calibration factors may be obtained. After obtaining the calibration factors, the reference light source 520a may be unloaded from the process chamber 100.

Referring back to FIG. 7, the controller 580 may obtain a final calibration factor from the calibration factors (in S14). Obtaining the final calibration factor may include multiplying the calibration factors by respective weights. Each of the weights may correspond to a relative ratio of an amount of plasma produced in a region specified by each of the incidence angles to a total amount of plasma. As an example, in the case where an amount of plasma in a region specified by the first incidence angle θ1 is greater than in a region specified by the third incidence angle θ3, which, in turn is greater than in a region specified by the second incidence angle θ2, the weight for the third angle may be greater than that for the first angle and the weight for the second angle may be greater than that for that third angle. Thus, to equalize the plasma amounts, weights may be provided assigned for respective angles. The weights for respective angles may be determined by various methods (e.g., using a simulation process or an optimization algorithm).

The following Table 2 shows light amounts of plasma lights according to incidence angles in an example.

TABLE 2

| | |
|---|---|
| First plasma light beam PL1 with first incidence angle | 15 |
| Second plasma light beam PL2 with second incidence angle | 50 |
| Third plasma light beam PL3 with third incidence angle | 35 |

The controller 580 may obtain a final calibration factor using calibration factors and weights. As an example, the final calibration factor may be obtained by multiplying the calibration factors by respective weights and summing them. That is, the final calibration factor may be expressed as a single constant. As shown in Table 2, the weights of the first, second, and third plasma lights were 0.15, 0.5, and 0.35, respectively. Meanwhile, in the case where the same plasma process is performed, there may be no difference in plasma distribution between the process chambers, and thus, the weight for the plasma light may be regarded to be the same from chamber to chamber. Thus, from Tables 1 and 2, the final calibration factor may be given as 1.3875 (i.e., 0.15*0.9166667+0.5*1.1+0.35*2). Once the final calibration factor is obtained, OES intensities obtained from a plurality of process chambers may be calibrated at once, without separately calibrating the OES intensities in accordance with respective incidence angles of the lights. The calibration of the OES intensities using the final calibration factor may include dividing an OES intensity obtained from the second process chamber by the final calibration factor. The above Table 2 illustrates examples and may be variously modified.

Once the calibration of the optical emission spectroscopy system 500 is finished, an inspection process on the process chamber 100 may be performed (in S20). The inspection process may be performed to examine or inspect an internal state of the process chamber 100, allowing the plasma process to be more effectively performed. In the optical emission spectroscopy system 500, the inspection process on the process chamber 100 may be performed using the light receiving part 540, the analyzing part 560, and the controller 580, without the reference light source 520 and the sub-calibrating part 530. In an embodiment, the inspection process on the process chamber 100 may include producing plasma in the process chamber 100, and measuring and inspecting plasma light.

When the inspection of the process chamber is finished, a plasma process on a substrate may be executed (in S30). For example, the substrate may be loaded on the stage 200 in the process chamber 100, and then, the plasma process may be performed on the substrate. In the present specification, a substrate may be a semiconductor wafer used to fabricate a semiconductor device, a glass substrate used to fabricate a flat panel display device, and the like. The plasma process on the substrate may be an etching process, a chemical vapor deposition process, an ashing process, a cleaning process, and the like.

FIG. 7 illustrates an example in which the plasma process is performed after the OES calibration, but in an embodiment, the OES calibration may be performed after the plasma process. In an embodiment, the plasma process on the substrate may be performed twice, e.g., before and after the OES calibration.

According to some embodiments, an optical emission spectroscopy system and a method of calibration the same may be different. A difference between light intensities caused by a difference between incidence angles may be compensated in consideration of calibration factors, which are given in accordance with the incidence angles. Thus, the optical emission spectroscopy system may be more precisely calculated. Furthermore, when the optical emission spectroscopy system is calibrated based on a final calibration factor, the optical emission spectroscopy system may be calibrated more simply.

Figure 10:
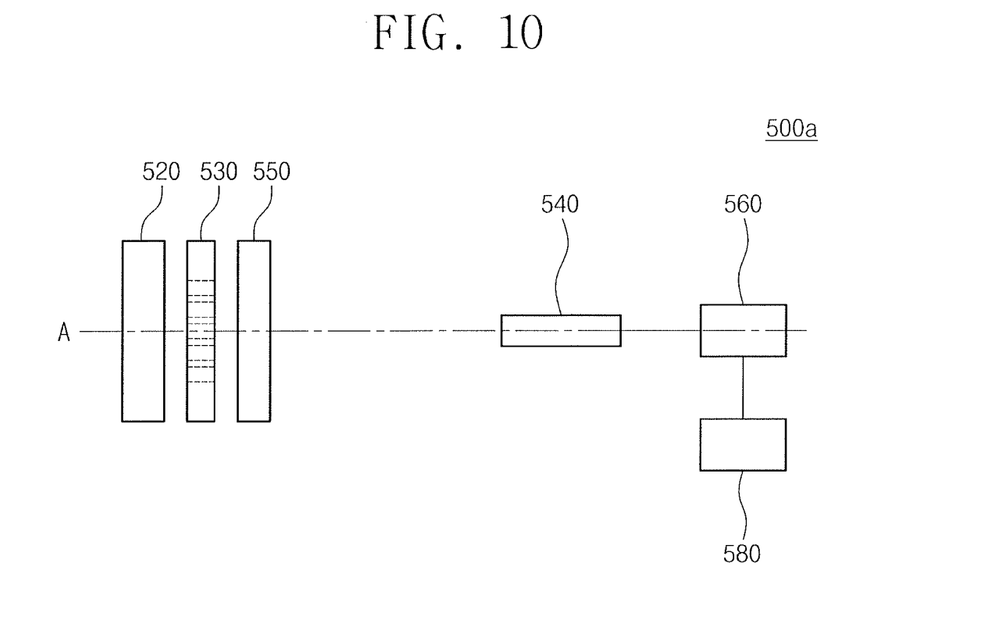
FIG. 10 illustrates an optical emission spectroscopy system according to some embodiments.
Figure 11:
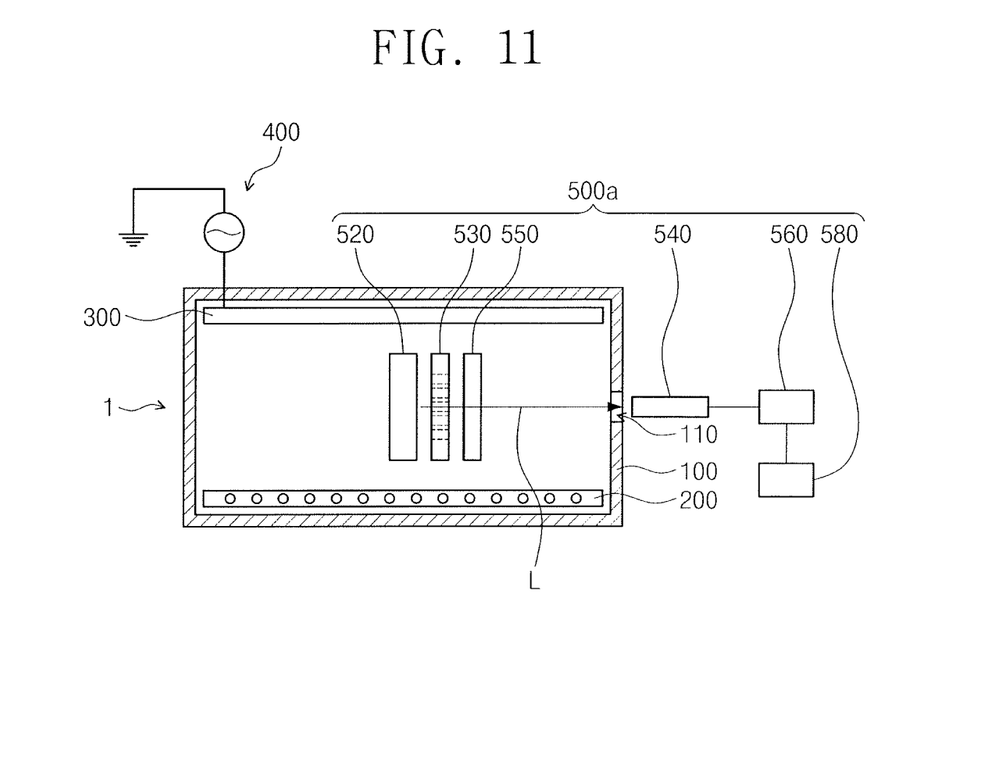
FIG. 11 illustrates a plasma processing system and an optical emission spectroscopy system of FIG. 10.

FIG. 10 is an optical emission spectroscopy system 500a according to some embodiments. FIG. 11 illustrates the plasma processing system 1 and the optical emission spectroscopy system 500a of FIG. 10. In the following description of the optical emission spectroscopy system 500a of FIG. 10, an element, which is substantially the same as that of the optical emission spectroscopy system 500 described with reference to FIG. 4, will be identified by the same reference number without repeating an overlapping description thereof. The optical emission spectroscopy system 500a may further include a calibrator, e.g., a calibrating part 550. In contrast to the sub-calibrating part 530, which may consider light incident at different angles thereon individually, the calibrating part 550 may simultaneously calibrate light at different angles thereon.

The calibrating part 550 may be between the reference light source 520 and the light receiving part 540. The calibrating part 550 may be on the same central axis A as the reference light source 520, the sub-calibrating part 530, and the light receiving part 540. Although the sub-calibrating part 530 is illustrated to be between the reference light source 520 and the calibrating part 550, but in certain embodiments, the sub-calibrating part 530 may be omitted or the calibrating part 550 may be between the reference light source 520 and the sub-calibrating part 530. The calibrating part 550 may be provided to have a size corresponding to that of the reference light source 520, e.g., such that all light emitted from the reference light source 520 may be incident on the calibrating part 520.

The calibrating part 550 may calibrate an optical property (e.g., intensity) of light L incident on the light receiving part 540 such that a light receiving ratio is changed depending on an incidence angle of the light L. As an example, the calibrating part 550 may calibrate a light amount of the light L incident on the light receiving part 540 in accordance with its incidence angle. The calibrating part 550 may be fabricated in consideration of the afore-described weights. For example, the calibrating part 550 may be fabricated such that a region with a high weight has transmittance higher than that of another region with a low weight. In an embodiment, the calibrating part 550 may be placed in front of the reference light source 520 in a propagation direction of the light L to allow the distribution in light amount of the light L incident on the light receiving part 540 to become similar to the distribution of plasma. The calibrating part 550 may be fabricated to include a plurality of regions having different transmittances and the structure of the calibrating part 550 may be variously changed.

Figure 12:
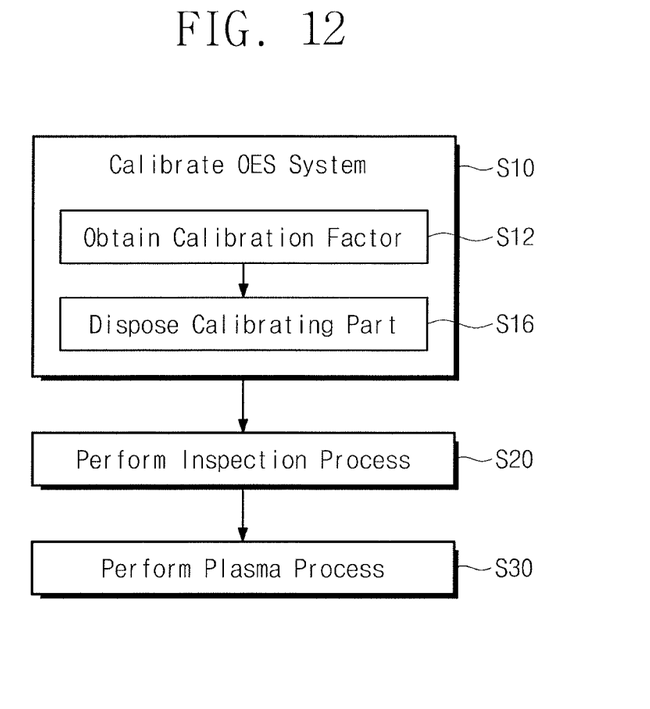
FIG. 12 illustrates a flowchart of fabricating a semiconductor device, using the plasma processing system and the optical emission spectroscopy system of FIG. 11.
Figure 13A:
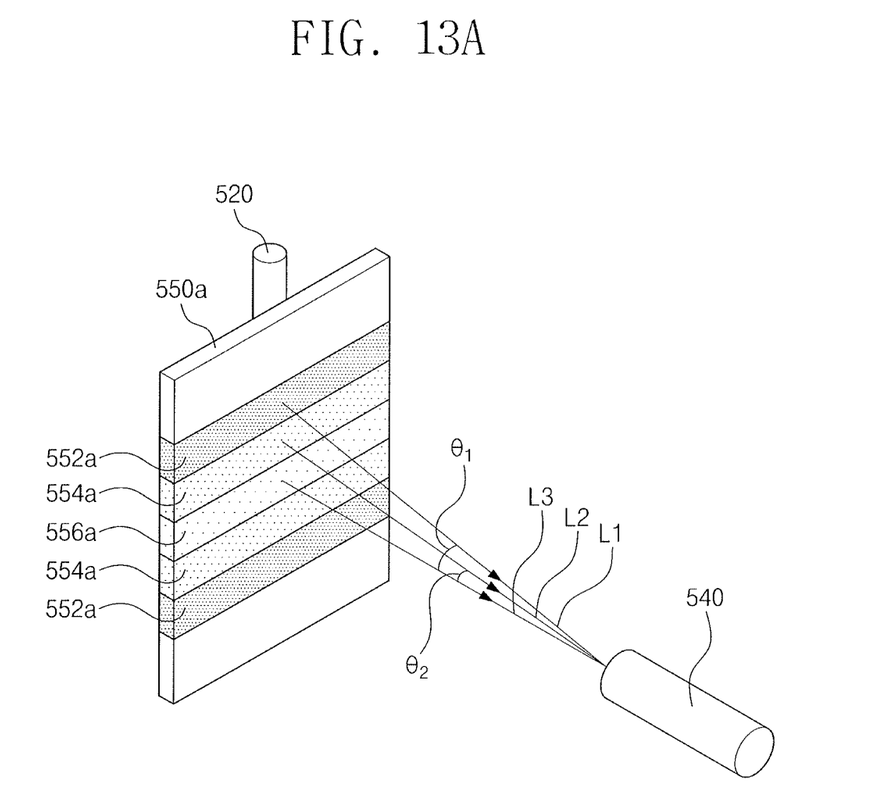
FIG. 13A illustrates a calibrating part of FIG. 10, according to some embodiments.
Figure 13B:
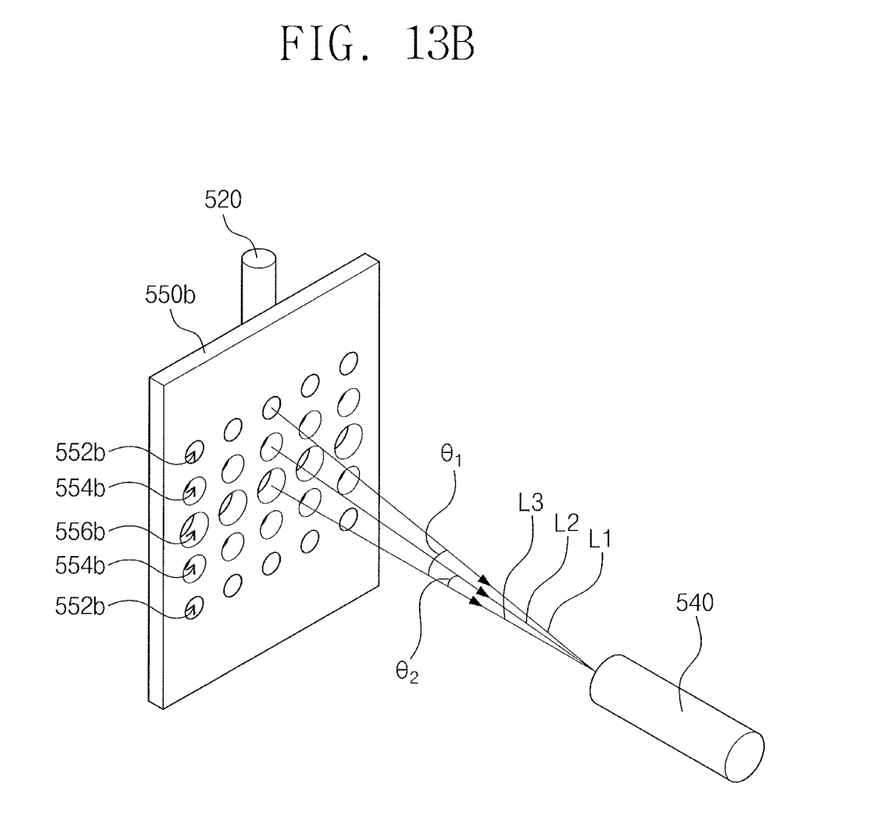
FIG. 13B illustrates a calibrating part of FIG. 10, according to some embodiments.

FIG. 12 illustrates a flowchart of a process of fabricating a semiconductor device, using the plasma processing system 1 and the optical emission spectroscopy system 500a of FIG. 11. FIG. 13A illustrates a calibrating part 550a of FIG. 10, according to some embodiments. FIG. 13B illustrates a calibrating part 550b of FIG. 10, according to some embodiments. Steps S12, S20, and S30 in FIG. 12 (e.g., of obtaining a calibration factor, performing an inspection process, and performing a plasma process) may be performed in the same or similar manner as those in FIG. 7, and thus, a detailed description thereof will be omitted. The calibration of the optical emission spectroscopy system 500a may further include disposing the calibrating part 550 using obtained calibration factors (in S16).

Referring to FIG. 13A, the calibrating part 550a may include a first filter 552a, a second filter 554a, and a third filter 556a. The first filter 552a may be positioned at the first angle θ1 to the central axis A of FIG. 10, the second filter 554a may be positioned at the second angle θ2 to the central axis A, and the third filter 556a may be positioned on a plane including the central axis A. In other words, the first light beam L1 passing through the first filter 552a may have the first incidence angle θ1 on the light receiving part 540, the second light beam L2 passing through the second filter 554a may have the second incidence angle θ2 on the light receiving part 540, and the third light beam L3 passing through the third filter 556a may be perpendicularly incident on the light receiving part 540. Transmittances of the first, second, and third filters 552a, 554a, and 556a may be different from each other. As an example, the transmittance of the first filter 552a may be lower than that of the second filter 554a, and the transmittance of the second filter 554a may be lower than that of the third filter 556a.

Referring to FIG. 13B, the calibrating part 550b may include a first opening 552b, a second opening 554b, and a third opening 556b. The first opening 552b may be positioned to have the first angle θ1 to the central axis A of FIG. 10, the second opening 554b may be positioned to have the second angle θ2 to the central axis A, and the third opening 556b may be positioned on a plane including the central axis A. In other words, the first light beam L1 passing through the first opening 552b may have the first incidence angle θ1 on the light receiving part 540, the second light beam L2 passing through the second opening 554b may have the second incidence angle θ2 on the light receiving part 540, and the third light beam L3 passing through the third opening 556b may be perpendicularly incident on the light receiving part 540. In some embodiments, the first, second, and third openings 552b, 554b, and 556b may have sizes different from each other. As an example, the size of the first opening 552b may be smaller than the size of the second opening 554b, and the size of the second opening 554b may be smaller than the size of the third opening 556b. An example, in which the openings are provided to have a hole or circular shape, has been described, but the openings may be provided to have a slit shape or any other shape.

The calibrating part may include a first liquid crystal, a second liquid crystal, and a third liquid crystal. The calibrating part including the first liquid crystal, the second liquid crystal, and the third liquid crystal may have the same shape as the calibrating part 550a of FIG. 12A. The first liquid crystal may be positioned to have a first angle to a central axis, the second liquid crystal may be positioned to have a second angle to the central axis, and the third liquid crystal may be positioned on a plane including the central axis. In other words, a first light passing through the first liquid crystal may have a first incidence angle to the light receiving part 540, a second light passing through the second liquid crystal may have a second incidence angle to the light receiving part 540, and a third light passing through the third liquid crystal may be perpendicularly incident on the light receiving part 540. The controller 580 may apply different voltages to the liquid crystals, such that the first, second, and third liquid crystals may have transmittances different from each other. As an example, the transmittance of the first liquid crystal may be lower than that of the second liquid crystal, and the transmittance of the second liquid crystal may be lower than that of the third liquid crystal.

According to some embodiments, the calibrating part 550, 550a, or 550b may be configured in such a way that distribution in light amount of light emitted from the reference light source 520 of the optical emission spectroscopy system 500a becomes similar to the distribution of plasma. Since the optical emission spectroscopy system 500a includes the calibrating part 550, 550a, or 550b, to realize a transmittance difference according to a difference in incidence angle, an intensity of light incident on the light receiving part 540 may be controlled depending on an incident angle of the light. Thus, an additional calibration process for improving reliability of the inspection process may be omitted.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods described herein.

The calculation parts and other processing features of the disclosed embodiments may be implemented in logic which, for example, may include hardware, software, or both. When implemented at least partially in hardware, the calculation units, control units, and other processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the parts and other processing features may include, e.g., a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

According to some embodiments, an optical emission spectroscopy system with improved accuracy and reliability and a method of calibrating the same may be provided.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An optical emission spectroscopy system, comprising:
a reference light source;
an analyzer to receive and analyze light transmitted from the reference light source; and
a calibrator to calibrate light emitted from the reference light source, the reference light source, the analyzer, and the calibrator being coaxial along a central axis, and the light transmitted from the reference light source being incident on the calibrator at different incidence angles with respect to the central axis,
wherein facing surfaces of the reference light source and the calibrator are parallel to each other, and
wherein the calibrator calibrates a light intensity of the light incident thereon in accordance with the different incidence angles.

2. The system as claimed in claim 1, further comprising a process chamber to perform a plasma process, the reference light source and the calibrator being inside the process chamber.

3. The system as claimed in claim 2, wherein the calibrator includes:
a first filter to transmit light to a light receiver of the calibrator at a first incidence angle of the different incidence angles; and
a second filter to transmit light to the light receiver of the calibrator at a second incidence angle of the different incidence angles,
wherein transmittance of the first filter is different from that of the second filter.

4. The system as claimed in claim 2, wherein the calibrator includes:
a first opening that allows light incident at a first incidence angle of the different incidence angles to pass therethrough toward a light receiver of the calibrator; and
a second opening that allows light incident at a second incidence angle of the different incidence angles to pass therethrough toward the light receiver the calibrator,
wherein a size of the first opening is different from that of the second opening.

5. The system as claimed in claim 2, wherein the calibrator includes:
a first liquid crystal that transmits light incident at a first incidence angle of the different incidence angles to a light receiver of the calibrator; and
a second liquid crystal that transmits light incident at a second incidence angle of the different incidence angles to the light receiver of the calibrator,
wherein transmittance of the first liquid crystal is different from that of the second liquid crystal.

6. The system as claimed in claim 2, wherein the calibrator is between the reference light source and the analyzer.

7. The system as claimed in claim 2, further comprising a sub-calibrator between the reference light source and the analyzer, the sub-calibrator being coaxial with the reference light source.

8. The system as claimed in claim 7, wherein the sub-calibrator includes a shade.

9. The system as claimed in claim 7, wherein the sub-calibrator includes a shutter.

10. The system as claimed in claim 7, further comprising a controller to control the sub-calibrator to obtain calibration factors in accordance with the different incidence angles.

11. The system as claimed in claim 10, wherein the analyzer uses the calibration factors to calibrate light incident on the analyzer in accordance with the different incidence angles.

12. The system as claimed in claim 10, wherein the analyzer obtains a final calibration factor from the calibration factors.

13. The system as claimed in claim 7, wherein the sub-calibrator is immediately adjacent to the reference light source, the sub-calibrator having a plate shape overlapping an entirety of the reference light source.

14. A method of calibrating an optical emission spectroscopy system, the method comprising:

emitting a light from a reference light source toward a calibrator, facing surfaces of the reference light source and the calibrator being parallel to each other;

calibrating the light emitted from the reference light source by the calibrator, the light emitted from the reference light source being incident on the calibrator at different incidence angles with respect to a central axis between the calibrator and the reference light source; and analyzing the calibrated light, wherein calibrating light emitted from the reference light source includes obtaining calibration factors in accordance with the different incidence angles.

15. The method as claimed in claim 14, wherein calibrating the light emitted from the reference light source further includes calibrating the light incident on the calibrator based on the obtained calibration factors.

16. The method as claimed in claim 14, wherein calibrating the light emitted from the reference light source further includes obtaining a final calibration factor from the calibration factors.

17. The method as claimed in claim 14, wherein calibrating the light emitted from the reference light source includes calibrating a light intensity in accordance with the different incidence angles.

18. A method of fabricating a device, the method comprising:

calibrating an optical emission spectroscopy system;

performing an inspection process on a process chamber, using the optical emission spectroscopy system;

loading a substrate in the process chamber; and performing a plasma process on the substrate, wherein calibrating the optical emission spectroscopy system includes:

emitting a light from a reference light source toward a calibrator, facing surfaces of the reference light source and the calibrator being parallel to each other, calibrating the light emitted from the reference light source by the calibrator, the light emitted from the reference light source being incident on the calibrator at different incidence angles with respect to a central axis between the calibrator and the reference light source, analyzing the calibrated light, and controlling an intensity of light in accordance with the different incidence angles.

19. The method as claimed in claim 18, wherein calibrating the optical emission spectroscopy system further includes obtaining calibration factors in accordance with the different incidence angles.

20. The method as claimed in claim 18, wherein the plasma process includes at least one of an etching process, a chemical vapor deposition process, an ashing process, or a cleaning process.

* * * * *